United States Patent
Zhu et al.

(10) Patent No.: US 11,451,246 B1
(45) Date of Patent: Sep. 20, 2022

(54) FEC CODEC MODULE

(71) Applicant: SHENZHEN LONTIUM SEMICONDUCTOR TECHNOLOGY CO., LTD., Guangdong (CN)

(72) Inventors: Xuansheng Zhu, Anhui (CN); Shenghui Bao, Anhui (CN); Hui Bian, Anhui (CN); Sai Gao, Anhui (CN); Xinrun Xing, Anhui (CN)

(73) Assignee: SHENZHEN LONTIUM SEMICONDUCTOR TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/459,118

(22) Filed: Aug. 27, 2021

(30) Foreign Application Priority Data

Jun. 8, 2021 (CN) .......................... 202110639106.6

(51) Int. Cl.
*H03M 13/29* (2006.01)
*H03M 13/15* (2006.01)
*H03M 13/00* (2006.01)
*H03M 13/27* (2006.01)

(52) U.S. Cl.
CPC ..... *H03M 13/2942* (2013.01); *H03M 13/159* (2013.01); *H03M 13/1515* (2013.01); *H03M 13/27* (2013.01); *H03M 13/6575* (2013.01)

(58) Field of Classification Search
CPC ................................................ H03M 13/2942
See application file for complete search history.

(56) References Cited

U.S. PATENT DOCUMENTS

| | | | |
|---|---|---|---|
| 6,625,774 B1 * | 9/2003 | Yang .................. | H03M 13/293 714/755 |
| 9,160,369 B1 * | 10/2015 | Miladinovic ..... | H03M 13/2942 |
| 2014/0215285 A1 * | 7/2014 | Wu .................. | H03M 13/2942 714/752 |
| 2020/0293400 A1 * | 9/2020 | Steiner ................. | G11C 29/52 |

* cited by examiner

*Primary Examiner* — Joseph D Torres
(74) *Attorney, Agent, or Firm* — Merchant & Gould P.C.

(57) ABSTRACT

An FEC codec module is provided. Code elements, i.e., code words of forward error correction code, are added to the data code stream of each transmission link through the codec module, so that accurate error determination and automatic error correction may be realized at the receiving end. The interleaving process is performed on multi-link data to prevent the occurrence of continuous burst errors in the data link in a transmission process, and the error correction capability of FEC is utilized to improve the data transmission efficiency and anti-interference ability of the system.

4 Claims, 3 Drawing Sheets

FEC CODEC MODULE

The present application claims priority to Chinese Patent Application No. 202110639106.6, titled "FEC CODEC MODULE", filed on Jun. 8, 2021 with the China National Intellectual Property Administration, which is incorporated herein by reference in its entirety.

FIELD

The present disclosure relates to the technology field of integrated circuits, and in particular to an FEC codec module.

BACKGROUND

Technical terms mentioned in this application are illustrated in the following:

FEC: Forward Error Correction;

RS code: Reed-Solomon code, assuming that the RS code is (62, 60, t=1), where t is the maximum number of detectable erroneous characters, i.e., resistant character number, the RS code includes 60 characters, a check code includes 2t characters, and the encoding efficiency of RS code (62, 60) is 60/62;

PH: a position where the RS code element is inserted in a data link;

Character Block: one character block consisting of 240 characters and 12 PH;

Super Block: one super block consisting of 64 character blocks;

PM: a start flag bit of each super block.

In the existing implementation process of the FEC_RS code (62, 60), each data link is independently encoded by an RS encoder once in a unit cycle, and only one character error can be corrected in each character block (including 60 characters).

Before the TX transmits link data, data is input into an FEC encode module. According to the existing FEC implementation method, 60 characters and 2 RS parity bits form one block. In each block, the 60 characters are valid information data; and the 2 RS parity bits are additional code elements in the link, which are used for determining and correcting possible erroneous characters. After the RX receives the link data, the link data is input into an FEC decode module; whether an error code exists in source data of the block is determined according to values of the RS parity bits in each block; and the error code is corrected if the error code exists. The processed link data is then sent to a next module for further analysis.

In the existing implementation technology of the FEC_RS code (62, 60), the interleaving function cannot be realized, and continuous burst errors in a link cannot be corrected. In addition, the existing implementation has a limited ability to determine error codes in the link, and cannot determine and correct a large number of error codes in the link.

SUMMARY

In view of this, a forward error correction (FEC) codec module is provided according to embodiments of the present disclosure, to detect and correct errors in a link with continuous errors.

To achieve the above objective, the present disclosure provides following technical solutions.

A forward error correction (FEC) codec module, includes an encoding module and an error correction module; where:

an encoding module includes: a first data interleaving module, four encoding calculation units, an encoding unit and a data selector;

a first data interleaving module is configured to perform an interleaving and reorganizing process on two paths of source data input to the first data interleaving module according to a preset method, and respectively send one high byte data and one low byte data in each of two cycles of the source data after interleaving and reorganizing process to four encoding calculation units, where each one of the four encoding calculation units obtains one high byte data or one corresponding low byte data in every two cycles;

each one of the four encoding calculation units is configured to perform a loop iterative calculation on obtained continuous 60 bytes of data, to obtain two parity values;

the encoding unit is configured to obtain parity values calculated by the four encoding calculation units, and perform a polarity encoding on the parity values;

the data selector is configured to obtain a polarity-encoded parity value, insert the polarity-encoded parity value into a PH position of the source data, and send the source data inserted with the parity value to the error correction module;

the error correction module includes: a second data interleaving module, a decoding module, a determination unit, an error positioning unit, and an output unit;

the second data interleaving module is configured to perform an interleaving and reorganizing process on the source data sent by the data selector, according to the preset method;

the decoding module is configured to perform a decoding process on the source data processed by the second data interleaving module to obtain the polarity-encoded parity value after the polarity encoding process in the source data, and perform a decoding and restoring process on the polarity-encoded parity value to obtain the parity value before the polarity encoding;

the determination unit is configured to calculate a syndrome value corresponding to the parity value obtained by the decoding module, determine whether the parity value decoded by the decoding module is wrong based on the syndrome value, and perform an error correction process on a data block corresponding to a wrong parity value;

the error positioning unit is configured to mark a position of an error character in the data block, based on the syndrome value calculated by the determination unit; and the output unit is configured to output the data block marked with the position of the error character.

Optionally, in the FEC codec module, the four encoding calculation units are specifically a first encoding unit, a second encoding unit, a third encoding unit, and a fourth encoding unit; where the first data interleaving module is configured to set a start flag bit in the input source data, send a high byte data in a first cycle after the start flag bit to the first encoding unit, send a low byte data in the first cycle after the start flag bit to the second encoding unit, send a high byte data in a second cycle after the start flag bit to the third encoding unit, and send a low byte data in the second cycle after the start flag bit to the fourth encoding unit.

Optionally, in the FEC codec module, each one of the four encoding calculation unit includes: a first multiplier, a second multiplier, a first adder, a second adder, a first logical AND gate, an output controller, a first trigger and second trigger; where a first input terminal of the output controller is configured to input the source data processed by the first data interleaving module, a second input terminal of the output controller is connected to an output terminal of the second trigger, and a control terminal of the output controller is configured to input a control signal;

a first input terminal of the first logic AND gate is connected to an output terminal of the first adder, and a second input terminal of the first logic AND gate is connected to the control terminal of the output controller;

an input terminal of the first multiplier and an input terminal of the second multiplier are both connected to an output terminal of the first logical AND gate;

an output terminal of the first multiplier is connected to an input terminal of the first trigger;

an output terminal of the first trigger is connected to a first input terminal of the second adder;

an output terminal of the second multiplier is connected to a second input terminal of the second adder;

an input terminal of the second trigger is connected to an output terminal of the second adder, and an output terminal of the second trigger is connected to a first input terminal of the first adder; and a second input terminal of the first adder is connected to the first input terminal of the output controller.

Optionally, in the FEC codec module, the determination unit includes a syndrome value calculation circuit, and the syndrome value calculation circuit includes: a third adder, a third multiplier, a third trigger, and a second logical AND gate; where a first input terminal of the third adder is connected to an output terminal of the second logical AND gate, and a second input terminal of the third adder is configured to obtain the parity value decoded by the decoding module;

a first input terminal of the third multiplier is connected to an output terminal of the third adder, and a second input terminal of the third multiplier is configured to input a preset coefficient; and an input terminal of the third trigger is connected to an output terminal of the third multiplier, an output terminal of the third trigger is connected to a first input terminal of the second logic AND gate, and a second input terminal of the second logic AND gate is configured to input a control signal.

In the technical solutions provided according to embodiments of the present disclosure, the codec module adds some code elements (code words of forward error correction code) into the data code stream of each transmission link, so that accurate error determination and automatic error correction may be realized at the receiving end. The interleaving process is performed on multi-link data to prevent the occurrence of continuous burst errors in the data link during transmission, and the error correction capability of FEC is utilized to a greater extent to improve the data transmission efficiency and anti-interference ability of the system.

BRIEF DESCRIPTION OF THE DRAWINGS

In order to clearly describe the technical solutions in the embodiments of the present disclosure or conventional technology, drawings to be used in the description of the embodiments and conventional technology are briefly described hereinafter. It is apparent that the drawings described below show merely some embodiments of the present disclosure. Those skilled in the art may obtain other drawings according to the provided drawings without any creative effort.

DETAILED DESCRIPTION OF EMBODIMENTS

The technical solutions in the embodiments of the present disclosure will be described clearly and completely hereinafter in conjunction with the drawings in the embodiments of the present disclosure. Apparently, the described embodiments are only a part of the embodiments of the present disclosure, rather than all embodiments. Based on the embodiments in the present disclosure, all of other embodiments, made by the person skilled in the art without any creative efforts, fall into the scope of protection of the present disclosure.

Figure 1:
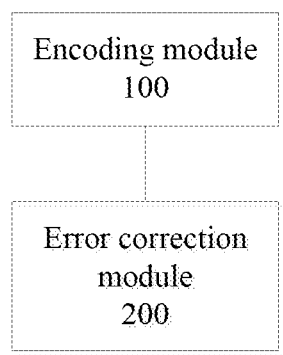
FIG. 1 is a structural schematic diagram of an FEC codec module according to an embodiment of the present disclosure.

To solve the problem that multiple error codes cannot be determined and corrected in the conventional technology, a forward error correction (FEC) codec module is provided according to an embodiment of the present disclosure. As shown in FIG. 1, the FEC codec module includes an encoding module 100 and an error correction module 200.

Figure 2:
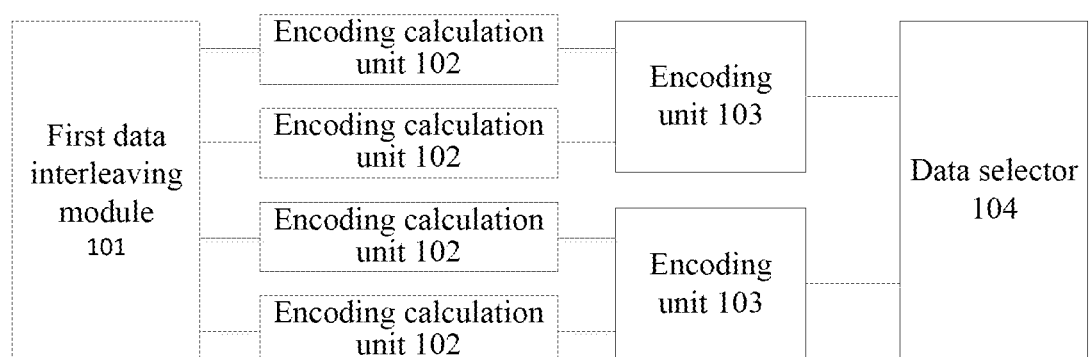
FIG. 2 is a structural schematic diagram of an encoding module in an FEC codec module according to an embodiment of the present disclosure.

Referring to FIG. 2, the encoding module 100 includes: a first data interleaving module 101, four encoding calculation units 102, an encoding unit 103 and a data selector 104.

The first data interleaving module 101 is configured to perform an interleaving and reorganizing process on two paths of source data input to the first data interleaving module according to a preset method. In this embodiment, two paths of link data are input to an input terminal of the first data interleaving module 101 to perform a data interleaving process by the first data interleaving module 101. The purpose of the data interleaving process is to prevent multi-bit continuous errors during transmission of any one path of link data. If multi-bit continuous errors occur in one path of link data during transmission, the continuous error data will be separated by the data interleaving process. For example, a source data input to the first data interleaving module 101 is ABCDEF, and the source data after the interleaving and reorganizing process of the first data interleaving module 101 becomes BADCFE. In this embodiment, two cycles of the source data after interleaving and reorganizing process is divided into one group. Four high and low byte data in the two cycles of the source data after the interleaving and reorganizing process are respectively sent to corresponding four encoding calculation units. Each encoding calculation unit obtains a corresponding high byte data or low byte data in every two cycles. For example, a high byte data in a first cycle of the source data after the interleaving and reorganizing process is sent to the first encoding calculation unit, a low byte data in the first cycle of the source data after the interleaving and reorganizing process is sent to the second encoding calculation unit, a high byte data in a second cycle of the source data after the interleaving and reorganizing process is sent to the third encoding calculation unit, and a low byte data in the second cycle of the source data after the interleaving and reorganizing process is sent to the fourth encoding calculation unit.

Each one of the four encoding calculation units 102 is configured to perform a loop iterative calculation on obtained continuous 60 bytes of data, until the last byte of the source data is calculated, to obtain a parity value of the source data. The encoding calculation unit is an RS encoder module. The RS encoder module includes an encoding circuit for calculating a parity value of each character block. The character block is a data block obtained by the RS encoder module and sent by the first data interleaving module 101. The character block herein is a set of source data, that is, each character block includes multiple source data. In this embodiment, the first data interleaving module 101 sends to the four encoding calculation units 102 high byte data and low byte data of each character block in two consecutive cycles of each of the two paths of link data after the reorganizing process, respectively. Each encoding calculation unit 102 calculates two parity values of each character block of the input source data, and four encoding calculation units 102 obtain 8 parity values for each character block. That is, a high byte data and a low byte data in the first cycle of the two consecutive cycles are sent to an RS encoding module A and an RS encoding module B respectively, and a high byte data and a low byte data of the second cycle of the two consecutive cycles are sent to an RS encoding module C and an RS encoding module D respectively. Specifically, in a process of calculating the parity value, each RS encoding module performs an iterative multiplication process on obtained byte data based on a preset generation polynomial, until the last byte of the character block (that is, the 60th character of the character block). Thus, the two parity values of the character block are obtained. Therefore, the RS code is the 60 characters of the character block plus the two parity values, making a total of 62 characters. In this embodiment, four high and low byte data output by the first data interleaving module in two consecutive cycles are sent to the four encoding calculation units respectively. Each of the four encoding calculation units perform a loop iterative calculation process on the byte data acquired until the last byte of the character block (that is, the 60th character of the character block). to obtain the two parity values. The two parity values plus the 60 characters of the character block is 62 characters, which is the RS (62, 60) code mentioned above.

Figure 4:
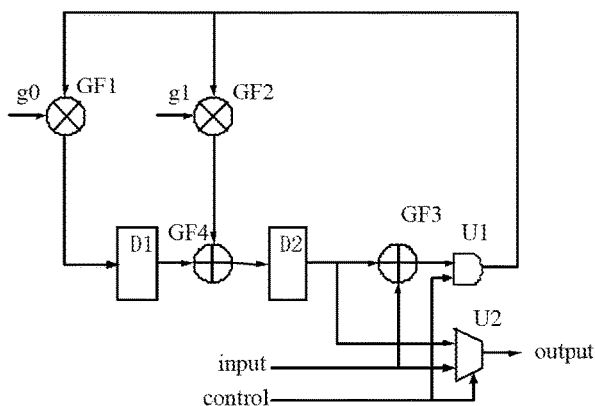
FIG. 4 is a structural schematic diagram of an encoding calculation unit in an encoding module.

The encoding calculation unit 102 may calculate the parity values of the character block through an RS encoding circuit. Referring to FIG. 4, the RS encoding circuit may include: a first multiplier GF1, a second multiplier GF2, a first adder GF3, a second adder GF4, a first logical AND gate U1, an output controller U2, a first trigger D1, and a second trigger D2.

A first input terminal of the output controller U2 is configured to input high byte data or low byte data of the source data processed by the first data interleaving module. A second input terminal of the output controller U2 is connected to an output terminal of the second trigger D2. A control terminal of the output controller U2 is configured to input a control signal.

A first input terminal of the first logic AND gate U1 is connected to an output terminal of the first adder GF3. A second input terminal of the first logic AND gate U1 is connected to the control terminal of the output controller U2.

An input terminal of the first multiplier GF1 and an input terminal of the second multiplier GF2 are both connected to an output terminal of the first logical AND gate U1.

An output terminal of the first multiplier GF1 is connected to an input terminal of the first trigger D1.

An output terminal of the first trigger D1 is connected to a first input terminal of the second adder GF4.

An output terminal of the second multiplier GF2 is connected to a second input terminal of the second adder GF4.

An input terminal of the second trigger D2 is connected to an output terminal of the second adder GF4. An output terminal of the second trigger D2 is connected to a first input terminal of the first adder GF3.

A second input terminal of the first adder GF3 is connected to the first input terminal of the output controller U2.

A polynomial of $g(x)=x^2+3x+2$ is generated by the encoding calculation unit 102 as shown in FIG. 4. A primitive polynomial of GF ($2^{10}$) domain is $p(x)=x^{10}+x^3+1$. The two parity values for each FEC module are calculated through hardware logic, where $g(x)$ is a preset coefficient.

The encoding unit 103 is configured to obtain the parity values calculated by the four encoding calculation units, and perform a polarity encoding on the parity values. In this embodiment, the encoding unit 103 performs 8B/10B encoding on the parity values calculated by the encoding calculation units 102. Since the parity values calculated by the RS encoding circuit do not satisfy the encoding polarity balance of the source data, the polarity encoding needs to be performed to make the parity values meet the direct current (DC) balance of the link data.

The data selector 104 is configured to obtain polarity-encoded parity values, and insert the polarity-encoded parity values into PH positions of the source data. The source data refers to previous source data before the interleaving and reorganizing process in the preset method. The source data is sent to the error correction module 200. The data selector inserts code elements generated by the previous modules into the source data stream of each link according to a certain arrangement manner, and transmits the inserted source data stream to the error correction module 200.

Data in the data link input to the encoding module 100 is distributed in the format of character block and super block. Each super block is inserted with one PM, serving as a start flag bit of the super block. The resistant character number of the RS (62, 60) code is 1, that is t=1, which means that only one character error can be corrected in one character block. To improve an anti-interference performance of the system, multiple encoding calculation units 102 running in parallel are utilized according to an embodiment of the present disclosure. High character data and low character data of the first cycle after PM are sent to the RS encoding module A and the RS encoding module B respectively, and high character data and low character data of the second cycle after PM are sent to the RS encoding module C and the RS encoding module D respectively. Thus, the resistant character number of the RS code is four (that is, t=4), which means that four continuous character errors in the transmission process can be determined and corrected.

If a link data Lane0 or a link data Lane1 of the two link data has 8 consecutive character errors in the transmission process, this kind of continuous errors cannot be determined and corrected in the conventional method. According to the embodiments of the present disclosure, the first data interleaving module 101 is utilized to perform an interleaving process on the two paths of link data, which can effectively deal with the continuous error in a certain link data. That is, the two paths of link data input into the encoding module 100 are interleaved firstly. For example, data of the third or fourth cycle after PM in the link data Lane0 is interleaved with data of the first or the second cycle after PM in the link data Lane1; data of the seventh or the eighth cycle in the link data Lane0 are interleaved with data of the fifth or the sixth cycle in the link data Lane1, and so on. In this way, the problem of continuous errors can be solved. The eight consecutive characters are sent to different encoding calculation units 102 for encoding, so as to determine and correct all errors.

Figure 3:
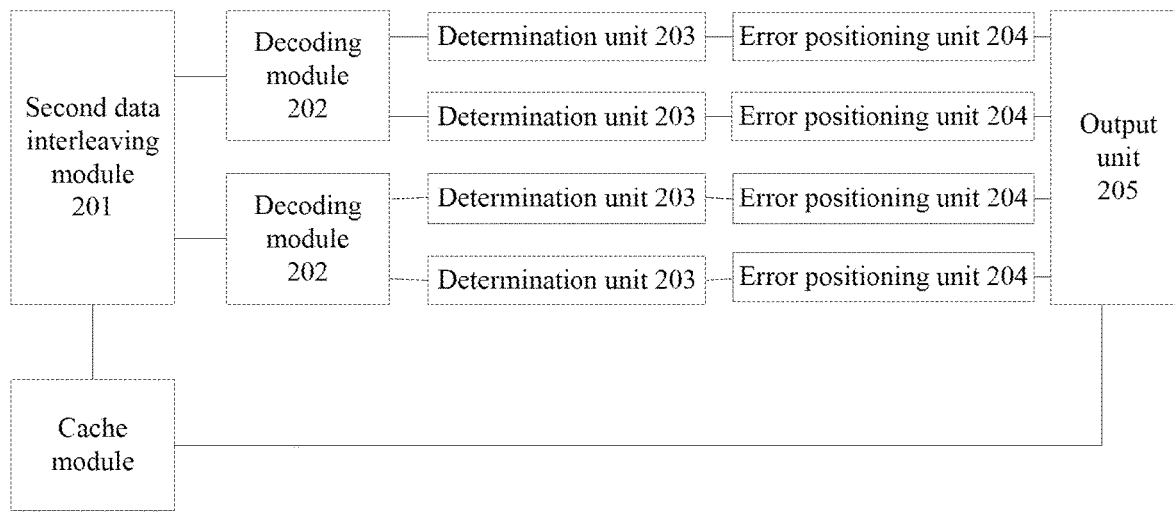
FIG. 3 is a structural schematic diagram of an error correction module in an FEC codec module according to an embodiment of the present disclosure.

Referring to FIG. 3, the error correction module 200 includes: a second data interleaving module 201, a decoding module 202, a determination unit 203, an error positioning unit 204, and an output unit 205.

The second data interleaving module 201 is configured to: perform an interleaving and reorganizing process on the source data sent by the data selector, according to a preset method; obtain a parity value in the interleaved source data; send the parity value to the decoding module 202, and send other valid data in the interleaved source data to a cache module for caching. For example, a source data stream input into the encoding module is ABCDEF, and the first data interleaving module interleaves the source data ABCDEF to obtain an interleaved source data BADCFE. Two parity values (GH) for the interleaved source data BADCFE are calculated and a polarity encoding is performed on the two parity values. Then the two polarity-encoded parity values GH are inserted into the source data, and finally the source data stream becomes ABCDEF_GH. Thus the source data stream received by the second data interleaving module is ABCDEF_GH. The two parity values GH inside the source data ABCDEF_GH is generated based on the interleaved source data of BADCFE, so the source data stream ABCDEF needs to be interleaved into the interleaved source data BADCFE firstly.

The decoding module 202 is configured to perform a decoding process on the parity value in the source data processed by the second data interleaving module, to obtain a polarity-encoded parity value in the source data. The decoding module obtains the parity value sent by the second data interleaving module 201. Since the parity value is the parity value after the polarity encoding, it is necessary to decode and restore the parity value to obtain a parity value before the polarity encoding.

The determination unit 203 is configured to calculate a syndrome value of the source data processed by the second data interleaving module based on the source data inserted with the parity value after the decoding and restoring process, determine whether the source data is wrong based on the syndrome value, and perform an error correction process on the source data if the source data is determined to be wrong. In this embodiment, a loop iterative calculation is performed on the source data inserted with the parity value after the decoding and restoring process (that is, data which is obtained by processing an output data of the second data interleaving module 201 by the decoding module 202), until the last character of the source data, to obtain two syndrome values. If both the two syndrome values are 0, it is determined that the source data input to the first data interleaving module 101 is correct. If any one of the two syndrome values is not 0, it is determined that the source data input to the first data interleaving module 101 is not correct. An error correction process is performed on the source data if the source data is not correct.

The error positioning unit 204 is configured to determine a position of an error character in the source data based on the syndrome value.

The output unit 205 is configured to output a data block marked with the position of the error character.

Figure 5:
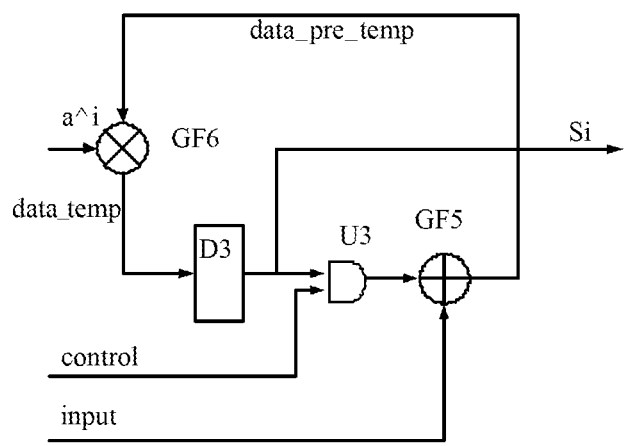
FIG. 5 is a structural schematic diagram of a determination unit in an error correction module.

The determination unit 203 calculates the syndrome values by means of a syndrome value calculation circuit as shown in FIG. 5. Two syndrome values, that is, S0 and S1, are obtained by inputting each character block (that is, the source data inserted with the parity value after the decoding and restoring process) into the syndrome value calculation circuit. The determination unit determines whether the character block is wrong according to the property of the RS code and the values of S0 and S1, and the error correction process may be performed on the wrong character block.

The syndrome value calculation circuit includes: a third adder GF5, a third multiplier GF6, a third trigger D3, and a second logical AND gate U3.

A first input terminal of the third adder GF5 is connected to an output terminal of the second logical AND gate U3. A second input terminal of the third adder GF5 is configured to obtain the source data inserted with the parity value after the decoding and restoring process.

A first input terminal of the third multiplier GF6 is connected to an output terminal of the third adder GF5. A second input terminal of the third multiplier GF6 is configured to input a preset coefficient.

An input terminal of the third trigger D3 is connected to an output terminal of the third multiplier GF6. An output terminal of the third trigger D3 is connected to a first input terminal of the second logic AND gate U3. A second input terminal of the second logic AND gate U3 is configured to input a control signal.

The above embodiments in the present disclosure are described in a progressive manner. Each of the embodiments is mainly focused on describing its differences from other embodiments, and references may be made among these embodiments with respect to the same or similar portions among these embodiments. Descriptions of the apparatus disclosed in the embodiments are simple since the apparatus corresponds to the method disclosed in the embodiments, and related explanations can be found in descriptions of the method.

Based on the above description of the disclosed embodiments, those skilled in the art are capable of carrying out or using the present disclosure. It is obvious for those skilled in the art to make many modifications to these embodiments. The general principle defined herein may be applied to other embodiments without departing from the spirit or scope of the present disclosure. Therefore, the present disclosure is not limited to the embodiments illustrated herein, but should be defined by the broadest scope consistent with the principle and novel features disclosed herein.

The invention claimed is:

1. A forward error correction (FEC) codec module, comprising an encoding module and an error correction module; wherein the encoding module comprises: a first data interleaving module, four encoding calculation units, an encoding unit and a data selector;

the first data interleaving module is configured to perform an interleaving and reorganizing process on two paths of source data input to the first data interleaving module according to a preset method, and respectively send one high byte data and one low byte data in each of two cycles of the source data after the interleaving and reorganizing process to corresponding four encoding calculation units, wherein each one of the four encoding calculation units obtains one corresponding high byte data or one corresponding low byte data in every two cycles;

each one of the four encoding calculation units is configured to perform a loop iterative calculation on obtained continuous 60 bytes of data, to obtain two parity values;

the encoding unit is configured to obtain parity values calculated by the four encoding calculation units, and perform a polarity encoding process on the parity values; and the data selector is configured to obtain a polarity-encoded parity value, insert the polarity-encoded parity value into a PH position of the source data, and send the source data inserted with the parity value to the error correction module;

the error correction module comprises: a second data interleaving module, a decoding module, a determination unit, an error positioning unit, and an output unit;

the second data interleaving module is configured to perform an interleaving and reorganizing process on the source data sent by the data selector, according to the preset method;

the decoding module is configured to perform a decoding and restoring process on a parity value in the source data processed by the second data interleaving module;

the determination unit is configured to calculate a syndrome value of the source data processed by the second data interleaving module, based on the source data inserted with the parity value after the decoding and restoring process, determine whether the source data is wrong based on the syndrome value, and perform an error correction process on the source data if the source data is determined to be wrong;

the error positioning unit is configured to determine a position of an error character in the source data based on the syndrome value; and the output unit is configured to output a character block marked with the position of the error character.

2. The FEC codec module according to claim 1, wherein the four encoding calculation units are a first encoding unit, a second encoding unit, a third encoding unit, and a fourth encoding unit;

the first data interleaving module is configured to set a start flag bit in the input source data, send a high byte data in a first cycle after the start flag bit to the first encoding unit, send a low byte data in the first cycle after the start flag bit to the second encoding unit, send a high byte data in a second cycle after the start flag bit to the third encoding unit, and send a low byte data in the second cycle after the start flag bit to the fourth encoding unit.

3. The FEC codec module according to claim 1, wherein each of the four encoding calculation units comprises a Reed-Solomon (RS) encoding circuit configured to calculate the parity value, and the RS encoding circuit comprises: a first multiplier, a second multiplier, a first adder, a second adder, a first logical AND gate, an output controller, a first trigger and second trigger; wherein a first input terminal of the output controller is configured to input the source data processed by the first data interleaving module, a second input terminal of the output controller is connected to an output terminal of the second trigger, and a control terminal of the output controller is configured to input a control signal;

a first input terminal of the first logic AND gate is connected to an output terminal of the first adder, and a second input terminal of the first logic AND gate is connected to the control terminal of the output controller;

an input terminal of the first multiplier and an input terminal of the second multiplier are both connected to an output terminal of the first logical AND gate;

an output terminal of the first multiplier is connected to an input terminal of the first trigger;

an output terminal of the first trigger is connected to a first input terminal of the second adder;

an output terminal of the second multiplier is connected to a second input terminal of the second adder;

an input terminal of the second trigger is connected to an output terminal of the second adder, and an output terminal of the second trigger is connected to a first input terminal of the first adder; and a second input terminal of the first adder is connected to the first input terminal of the output controller.

4. The FEC codec module according to claim 3, wherein the determination unit comprises a syndrome value calculation circuit; and the syndrome value calculation circuit comprises: a third adder, a third multiplier, a third trigger, and a second logical AND gate; wherein:

a first input terminal of the third adder is connected to an output terminal of the second logical AND gate, and a second input terminal of the third adder is configured to obtain a source data inserted with the parity value after the decoding and restoring process;

a first input terminal of the third multiplier is connected to an output terminal of the third adder, and a second input terminal of the third multiplier is configured to input a preset coefficient; and an input terminal of the third trigger is connected to an output terminal of the third multiplier, an output terminal of the third trigger is connected to a first input terminal of the second logic AND gate, and a second input terminal of the second logic AND gate is configured to input a control signal.

* * * * *